(12) United States Patent
Matsufuji et al.

(10) Patent No.: US 7,630,226 B2
(45) Date of Patent: Dec. 8, 2009

(54) SEMICONDUCTOR DEVICE

(75) Inventors: Kensuke Matsufuji, Kawasaki (JP); Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 156 days.

(21) Appl. No.: 11/971,425

(22) Filed: Jan. 9, 2008

(65) Prior Publication Data
US 2008/0165586 A1 Jul. 10, 2008

(30) Foreign Application Priority Data
Jan. 9, 2007 (JP) .............................. 2007-001537

(51) Int. Cl.
*G11C 17/00* (2006.01)
(52) U.S. Cl. ................ 365/96; 365/230.06; 365/185.23
(58) Field of Classification Search .................. 365/96, 365/230.06, 185.23, 185.13, 185.14, 189.04, 365/189.03
See application file for complete search history.

(56) References Cited
U.S. PATENT DOCUMENTS
2006/0193163 A1* 8/2006 Ito ............................. 365/149
2006/0262627 A1* 11/2006 Fricke et al. ............. 365/225.7
2008/0002504 A1 1/2008 Nakano et al.

FOREIGN PATENT DOCUMENTS
JP 05-226599 9/1993

OTHER PUBLICATIONS
U.S. Appl. No. 11/833,054, filed Aug. 2, 2007, Namekawa, et al.
U.S. Appl. No. 11/839,199, filed Aug. 15, 2007, Matsufuji, et al.
U.S. Appl. No. 11/968,893, filed Jan. 3, 2008, Namekawa.
U.S. Appl. No. 12/140,071, filed Jun. 16, 2008, Matsufuji et al.

* cited by examiner

*Primary Examiner*—Dang T Nguyen
(74) *Attorney, Agent, or Firm*—Oblon, Spivak, McClelland, Maier & Neustadt, P.C.

(57) ABSTRACT

A memory cell includes: an irreversible storage element that writes data by breaking down an insulating film, with a write voltage being applied to its one end; and first and second transistors with one end being connected to the other end of the irreversible storage element. A non-volatile semiconductor storage device includes: the memory cell; write word lines and read word lines that are connected to the first transistor and the second transistor, respectively; write bit lines and read bit lines that are connected to the first transistor and the other end of the second transistor, respectively; a row decoder selectively driving the write word lines and the read word lines; and a write-disturb prevention circuit charging the read bit lines to a certain voltage in writing data.

15 Claims, 7 Drawing Sheets

SEMICONDUCTOR DEVICE

CROSS-REFERENCE TO RELATED APPLICATIONS

This application is based upon and claims the benefit of priority from the prior Japanese Patent Application No. 2007-1537, filed on Jan. 9, 2007, the entire contents of which are incorporated herein by reference.

BACKGROUND OF THE INVENTION

1. Field of the Invention

The present invention relates to an electrically readable/writable non-volatile semiconductor storage device.

2. Description of the Related Art

In Recent years, a semiconductor integrated circuit needs an embedded-type non-volatile semiconductor storage device with a relatively small size. The non-bolatile semiconductor storage device is required to be embedded on one chip, and continually retain the written information even if the power turned off. Such demands includes redundancy application in mass storage memory such as DRAM or SRAM, storage application for a code including an encryption key, management application in manufacture history, and the like.

Conventionally, a laser fuse has been used as a storage element for a non-volatile semiconductor storage device for these applications. However, when a laser fuse is used, a problem arises that would increase cost for writing because a specially fuse blow device and the associated blow process are required. In addition, since the minimum dimension of a laser fuse is determined by the wavelength of the laser beam in use, it does not keep in step with refinement of other semiconductor elements, causing a problem that the percentage of area occupied by a laser fuse could gradually increase. Further, since a laser is used to perform write operation, a laser fuse needs to be exposed when writing. As a result, if data write is needed after packaging, such a laser fuse may not be available. Therefore, recent years have raised hopes in electrically writable non-volatile storage elements.

As an example of such electrically writable nor-volatile storage elements, an anti-fuse element with a MOS structure is known in the art (see, for example, Japanese Patent Laid-Open No. (HEI) 5-226599). In a data write operation to the element, data is written by applying a high-voltage to both ends of the element to break down an insulating film. On the other hand, in data read operation, such a low voltage is applied to both ends of the anti-fuse element that would not break down the insulating film. Then, detection is made to determine whether the insulating film is broken down according to the amount of current, large or small, that flows into the anti-fuse. In this way, one-bit information is read. From the above, it can be seen that the anti-fuse element is one of the most promising non-volatile storage elements for future use, since it has such a simple data read/write operation that requires only voltage application to the both ends of the element.

However, mainly the following two problems have been observed at those non-volatile semiconductor storage devices using such an anti-fuse element with a MOS structure.

Firstly, the first problem relates to a "write disturb fault". In writing data to an anti-fuse element with a MOS structure, it is required to handle such a high voltage to break down the anti-fuse element that could also break down any other elements included in the same device. Thus, the anti-fuse element has only a low tolerance for noise caused by other circuits or for a leak current associated with a minute defect in elements included in a memory cell, which infrequently could cause a possible incorrect write operation to an unexpected memory cell. Such an incorrect write operation is referred to as a "write disturb fault".

Secondly, the second problem is an "insufficient test coverage". The anti-fuse element with a MOS structure, which is an irreversible non-volatile storage element that retains data by breaking down its internal structure, may not erase data after the write operation of that data. Thus, it is impossible to write data as a test to ensure the read and write operation. This means that the test coverage is insufficient.

Therefore, it is desirable to provide a non-volatile semiconductor storage device with high reliability that overcomes the above-mentioned problems associated with the write disturb fault and insufficient test coverage.

SUMMARY OF THE INVENTION

A non-volatile semiconductor storage device according to one aspect of the present invention comprises: a memory cell array including a plurality of memory cells arranged in a grid configuration, each of the plurality of memory cells comprising an irreversible storage element adapted to write data by breaking down an insulating film, with a write voltage being applied to its one end, a first transistor with its one end being connected to the other end of the irreversible storage element, and a second transistor with its one end being connected to the other end of the irreversible storage element; a plurality of write word lines connected to a gate of the first transistor to select among the memory cells in a row direction in writing data; a plurality of read word lines connected to a gate of the second transistor to select among the memory cells in a row direction in reading data; write bit lines connected to the other end of the first transistor to write data to the memory cells; read bit lines connected to the other end of the second transistor to read data from the memory cells; a row decoder selectively driving the write word lines and the read word lines according to an address signal; and a write-disturb prevention circuit for, in writing data, charging the read bit lines to a certain voltage.

In addition, a non-volatile semiconductor storage device according to one aspect of the present invention comprises: a memory cell array including a plurality of memory cells arranged in a grid configuration, each of the plurality of memory cells comprising an irreversible storage element adapted to write data by breaking down an insulating film, with a write voltage being applied to its one end, a first transistor with its one end being connected to the other end of the irreversible storage element, and a second transistor with its one end being connected to the other end of the irreversible storage element; a plurality of write word lines connected to a gate of the first transistor to select the memory cell in a row direction in writing data; a plurality of read word lines connected to a gate of the second transistor to select the memory cell, in a row direction in reading data; write bit lines connected to the other end of the first transistor to write data to the memory cells; read bit lines connected to the other end of the second transistor to read data from the memory cells; a row decoder selectively driving the write word lines and the read word lines according to an address signal and a test signal; and a data input/output block applying a first voltage to the write bit lines and a second voltage to the read bit lines according to an input signal and the test signal, the second voltage being different from the first voltage.

BRIEF DESCRIPTION OF THE DRAWINGS

Preferred embodiments of the present invention will now be described below with reference to the accompanying drawings, in which.

DETAILED DESCRIPTION OF THE EMBODIMENTS

Embodiments of a non-volatile semiconductor storage device according to the present invention will now be described below with reference to the accompanying drawings.

First Embodiment

Configuration of the First Embodiment

Figure 1:
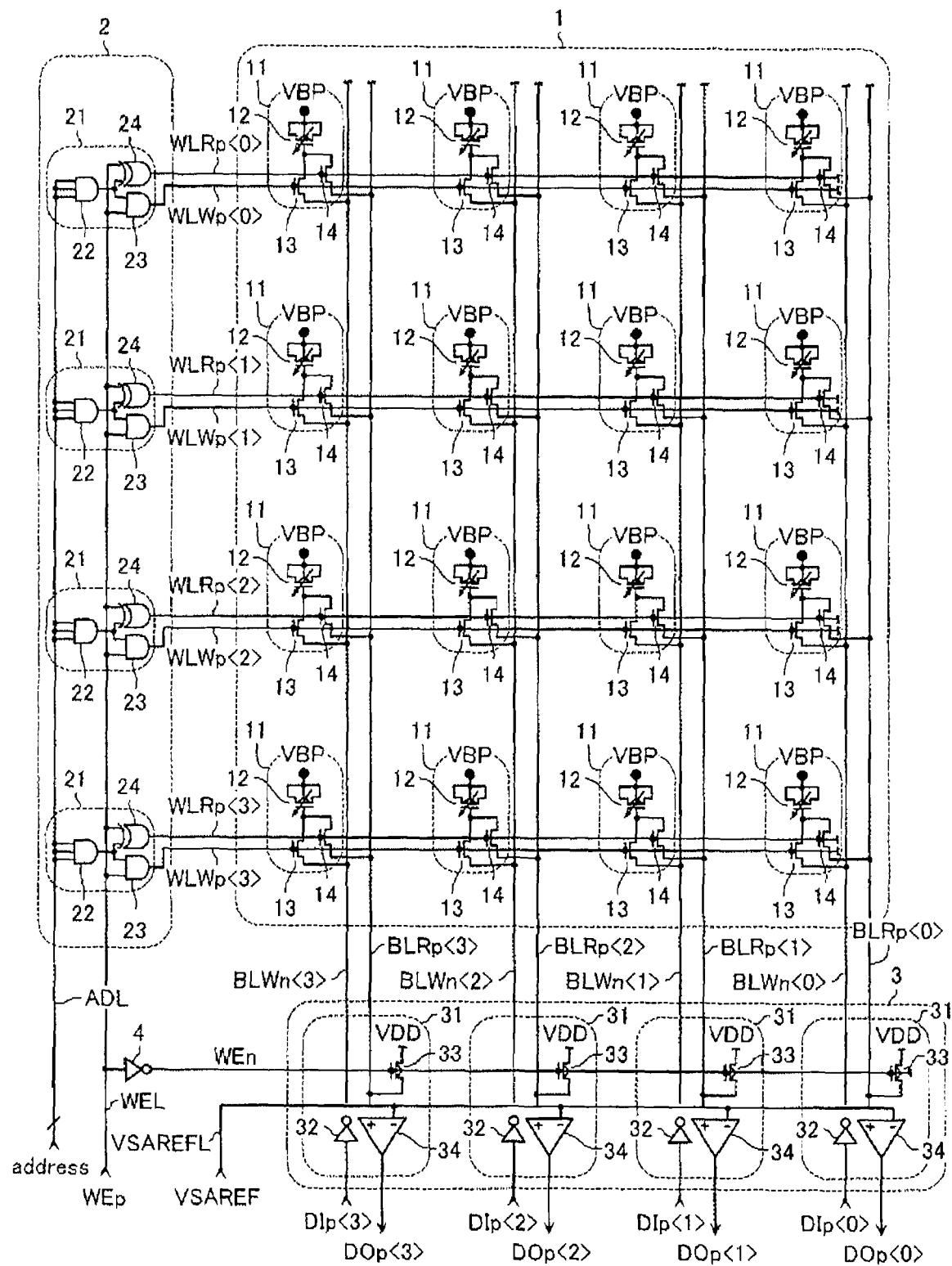
FIG. 1 is a schematic configuration diagram of a non-volatile semiconductor storage device according to a first embodiment of the present invention.

FIG. 1 is a schematic diagram of a non-volatile semiconductor storage device according to the first embodiment of the present invention. As illustrated in FIG. 1, the non-volatile semiconductor storage device according to the first embodiment mainly comprises: a memory cell array 1 arranged in a grid configuration; a row decoder 2; and a data input/output block 3.

The memory cell array 1 has a plurality of memory cells 11 arranged in a grid configuration. However, although the memory cell array 1 is illustrated to have with 16 bits (4×4) in FIG. 1, the present invention is not, of course, limited to the illustrated configuration.

Each of the plurality of memory cells 11 in row are connected to a pair of write word lines WLWp<0> to WLWp<3> and a pair of read word lines WLRp<0> to WLRp<3>, respectively. Similarly, Each of the plurality of memory cells 11 in column are connected to a pair of write bit lines BLWn<0> to BLWn<3> and a pair of read bit lines BLRp<0> to BLRp<3>, respectively. Here, a subscript "p" or "n" attached to each name of the signal lines mentioned above indicates whether the logic of each signal line is a "positive logic" or a "negative logic".

Each memory cell 11, comprises: an anti-fuse element 12; a write gate n-type transistor 13; and a read-gate n-type transistor 14. One end of each anti-fuse element 12 is connected to a memory cell power supply VBP, while the other end of each anti-fuse element 12 is connected to a drain terminal of the write gate n-type transistor 13 and to a drain terminal of the read-gate n-type transistor 14. A gate terminal of each write gate n-type transistor 13 is connected to one of write word lines WLWp<0> to WLWp<3>, while a source terminal of each write gate n-type transistor 13 is connected to one of write bit lines BLWn<0> to BLWn<3>. In addition, a gate terminal of each read-gate n-type transistor 14 is connected to one of read word lines WLRp<0> to WLRp<3>, while a source terminal of each read-gate n-type transistor 14 is connected to one of read bit lines BLRp<0> to BLRp<3>.

The row decoder 2 comprises a plurality of word line driving circuits 21. Each word line driving circuit 21 is connected to a row address signal line ADL. Each word line driving circuit 21 selectively drives any one of the write word lines WLWp<0> to WLWp<3> or any one of the read word lines WLRp<0> to WLRp<3>, in response to a row address signal "address" via the row address signal line ADL. Each word line driving circuit 21 comprises: a row selection logic circuit 22 that receives an input of a row address signal "address"; a write word line driving circuit 23 that receives an output of the row selection logic circuit 22; and a first read word line driving circuit 24 that receives an output of the row selection logic circuit 22. The row selection logic circuit 22 and the write word line driving circuit 23 each comprises an AND circuit. The first read word line driving circuit 24 comprises an XOR circuit.

Each of the write word line driving circuit 23 is connected to a write-operation control signal line WEL. Each of the write word line driving circuit 23 drives the write word lines WLWp<0> to WLWp<3> at a potential of the corresponding power supply VDD, e.g., at 3V, when the result is "1" that is obtained from the AND of a write-operation control signal WEp via a write-operation control signal line WEL and an output signal from a row selection logic circuit 22. Alternatively, when the result is "0", each write word line driving circuit 23 drives the write word lines WLWp<0> to WLWp<3> at the ground potential of 0V.

Similarly, each of the first read word line driving circuit 24 drives the read word lines WLRp<0> to WLRp<3> at a potential of the corresponding power supply VDD, e.g., at 3V, when the result is "1" that is obtained from the XOR of a write-operation control signal WEp and an output signal from a row selection logic circuit 22. Alternatively, when the result is "0", each of the first read word line driving circuit 24 drives the read word lines WLRp<0> to WLRp<3> at the ground potential of 0V.

The data input/output block 3 comprises a plurality of data input/output buffers 31. Each of the data input/output buffer 31 receives inputs of write signals DIp<0> to DIp<3> provided from the outside of the storage device and drives the write bit lines BLWn<0> to BLWn<3> accordingly. In addition, each of the data input/output buffer 31 amplifies each read signal via the read bit lines BLRp<0> to BLRp<3> to output read signals DOp<0> to DOp<3> to the outside of the storage device. Each of the data input/output buffer 31 with such a function comprises: a first write bit line driving circuit 32; a write-disturb prevention circuit 33 to prevent an incorrect write operation; and a read sense amplifier 34.

Each of the first write bit line driving circuit 32 receives inputs of write signals DIp<0> to DIp<3> provided from the outside of the storage device and drives the write bit lines BLWn<0> to BLWn<3> accordingly. Each of the first write bit line driving circuit 32 has an inverter function. During a write operation, the write bit lines BLWn<0> to BLWn<3> switch to the same potential as a low potential, power supply, i.e., 0V, and, in other cases, to the same potential as a corresponding power supply VDD, e.g., 3V.

Each of the write-disturb prevention circuit 33 comprises a p-type MOS transistor, with a source terminal connected to a power supply VDD, a drain terminal connected to one of the read bit lines BLRp<0> to BLRp<3>. A write control signal WEn in negative logic is input to its gate terminal. The write control signal. WEn in negative logic is generated by a write control circuit 4 from a write-operation control signal WEp that is provided from the outside. Then, the write control signal WEn is input to all of the write-disturb prevention circuits 33 in common. In response to the write control signal WEn in negative logic, each of the write-disturb prevention circuit 33 retains all read bit lines BLRp<0> to BLRp<3> at the same potential as a corresponding power supply VDD, e.g., 3V, during a write operation. This operation prevents incorrect write operations to a non-selected memory cell.

Each of the read sense amplifier 34 comprises a differential amplifier. The read bit lines BLRp<0> to BLRp<3> are connected to a non-inverting input terminal of each read sense amplifier 34, and a reference power supply VSAREF, which corresponds to an intermediate potential, is connected to an inverting input terminal of each read sense amplifier 34 via a reference power supply line VSAREFL. Each of the read sense amplifier 34 amplifies a minute potential difference between the non-inverting input terminal and the inverting input terminal to drive data output terminals DOp<0> to DOp<3> at 0V or 3V. However, the read sense amplifier 34 may comprise other elements than the differential amplifier, such as an initialization transistor or a latch circuit.

Read Operation of the First Embodiment

Next, a read operation of the non-volatile semiconductor storage device according to the first embodiment will be described below with reference to FIG. 2.

Figure 2:
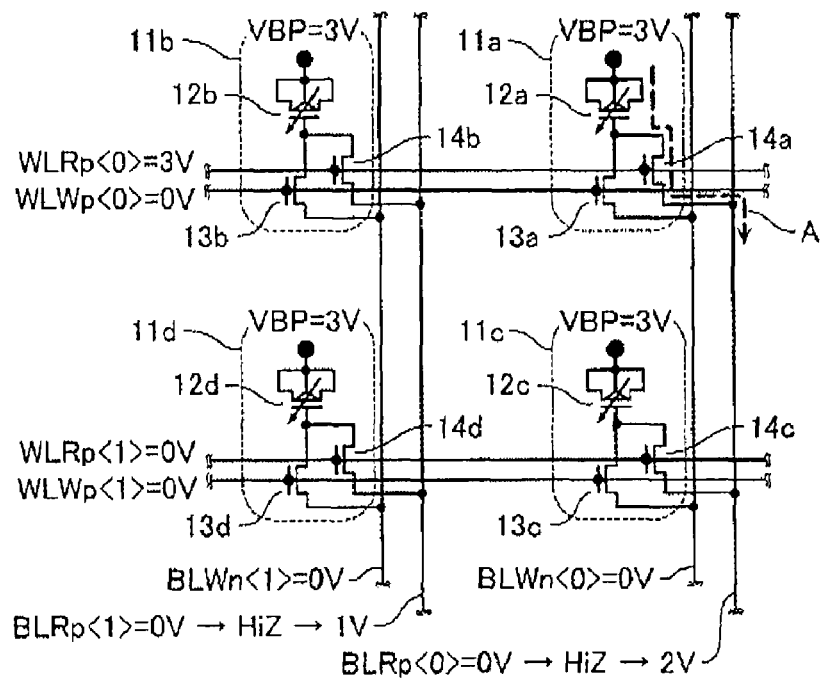
FIG. 2 is a diagram illustrating a read operation of the non-volatile semiconductor storage device according to the first embodiment of the present invention.

FIG. 2 is a diagram illustrating a read operation of the non-volatile semiconductor storage device according to the first embodiment. Although, for simplicity, only four memory cells 11 are illustrated in FIG. 2 that are described in conjunction with FIG. 1, other non-selected memory cells 11 that are not illustrated in FIG. 2 also operate in a similar manner. In addition, in FIG. 2, the same reference numerals represent the same components as FIG. 1. Besides, in the example illustrated in FIG. 2, it is assumed that a memory cell 11a is in a written state (data of "1") where an insulating film of an anti-fuse element 12a has already been broken down. The following read operation is performed for the memory cell 11a.

In this read operation, the memory cell power supply VBP first switches to a low voltage of 3V. In such a low voltage of 3V, anti-fuse elements 12b to 12d would not be broken down. While the memory cell power supply VBP retains a low voltage of 3V, each word line driving circuit 21 retains only a read word line WLRp<0> for selection at 3V, based on a row address signal "address" and a write-operation control signal WEp, and initializes the other read word line WLRp<1> as well as all write word lines WLWp<0> and WLWp<1> to 0V.

Then, each of the data input/output buffer 31 initializes all read bit lines BLRp<0> and BLRp<1> to 0V based on a write control signal WEn in negative logic, etc.

Then, each of the data input/output buffer 31 brings all of the read bit lines BLRp<0> and BLRp<1> into a high-impedance state HiZ.

This operation enables the memory cells in an arbitrary row, 11a and 11b in FIG. 2, to be electrically connected to read bit lines BLRp<0> and BLRp<1>.

On the other hand, the other two memory cells 11c and 11d are electrically disconnected from these read bit lines.

Besides, since all of the write gate n-type transistors 13a to 13d are brought into cut-off states, the voltage applied to each write bit line BLWn<0> and BLWn<1> may be in the range of the ground potential to the potential of the corresponding power supply VDD (0V to 3V). In the example of FIG. 2, for simplicity, the voltage is 0V.

Keeping the above-mentioned state, since the anti-fuse element 12a that retains data of "1" has the broken gate insulating film, a current flows into the other end from the memory cell power supply VBP of 3V through the gate insulating film (to the direction as labeled A, in FIG. 2).

Then, a read bit line BLRp<0> in a high-impedance state is charged by the current (as labeled A) through a read-gate n-type transistor 14a and transitions to a high-potential state. At this moment, the voltage-current property of the memory cell 11a is not always linear. Further, due to the phenomenon called "Vt down" that occurs in the read transistor 14a, the read bit line BLRp<0> reaches a relatively-high intermediate potential, e.g., 2V, but not the potential of the memory cell power supply VBP, 3V.

On the other hand, since the memory cell 11b that retains data of "0" has its gate insulating film intact, substantially no current flows into the other end when the potential of the memory cell power supply VBP remains at about 3V.

Therefore, even if a read-gate n-type transistor 14b is in a conductive state, little current flows and the read bit line BLRp<1> in a high-impedance state (HiZ) remains at a relatively low potential state, e.g., about 1V.

After a certain period of time has elapsed, the reference power supply VSAREF supplies an intermediate potential, e.g., 1.5V. Each of the read sense amplifier 34 compares the potential of each read bit line BLRp<0> to BLRp<3> with the potential of the reference power supply VSAREF. Similar to the read bit line BLRp<0>, if the potential of each read bit line BLRp<0> to BLRp<3> is higher than that of the reference power supply VSAREF, each of the read sense amplifier 34 determines that data of "1" is stored in the selected memory cell 11a and drives the output DOp<0> at a potential of the corresponding power supply VDD, e.g., 3V. An explanation of the read operation of the non-volatile semiconductor storage device according to the first embodiment has been given above.

Boost Operation of the First Embodiment

Figure 3:
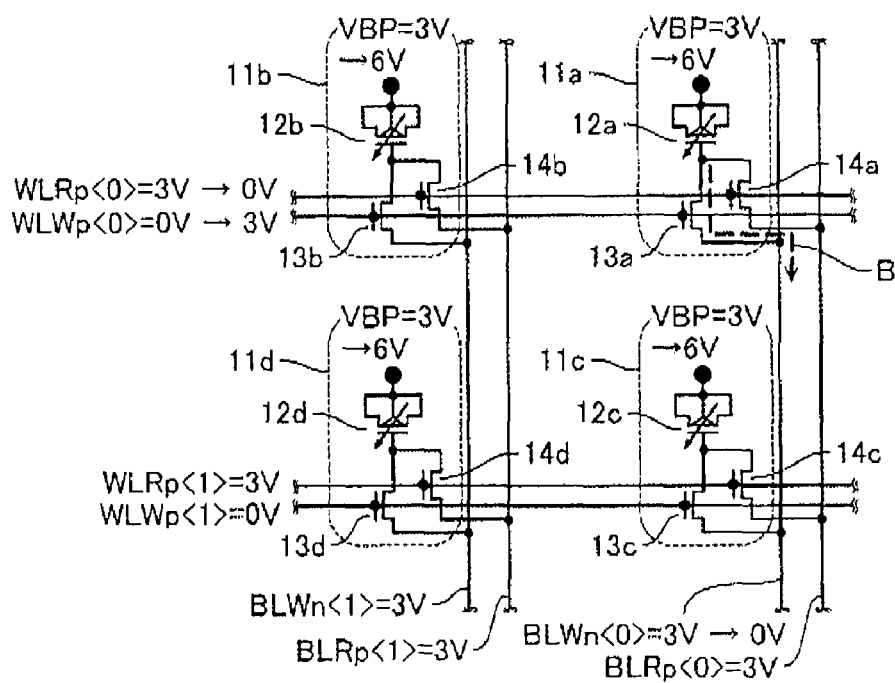
FIG. 3 is a diagram illustrating a boost operation and a write operation of the non-volatile semiconductor storage device according to the first embodiment of the present invention.

Next, a boost operation of the non-volatile semiconductor storage device according to the first embodiment will be described below with reference to FIG. 3. FIG. 3 is a diagram illustrating a boost operation and a write operation of the non-volatile semiconductor storage device according to the first embodiment. Although, for simplicity, only four memory cells 11 are illustrated in FIG. 3 that are described in conjunction with FIG. 1, other non-selected memory cells 11 that are not illustrated in FIG. 3 also operate in a similar manner.

In addition, in FIG. 3, the same reference numerals represent the same components as FIG. 1. Besides, in the example illustrated in FIG. 3, it is assumed that the insulating film of each anti-fuse element 12a to 12d remains intact (data of "0") for all memory cells 11a to 11d. In addition, the following boost operation is performed for the memory cell 11a.

In this boost operation, the memory cell power supply VBP first switches to a low voltage of 3V. When the memory cell power supply VBP is in such a low voltage of 3V, the insulating film of each anti-fuse element 12a to 12d would not be broken down.

As the memory cell power supply VBP switches to the low voltage of 3V, the data input/output buffer 31 brings all of the write bit lines BLWn<0> and BLWn<1> and all of the read bit lines BLRp<0> and BLRp<1> to the same potential as a corresponding power supply VDD, e.g., 3V, based on a write control signal WEn in negative logic, etc.

Further, each of the word line driving circuit 21 brings all of the read word lines WLRp<0> and WLRp<1> into a selected state (the same potential as a corresponding power supply VDD) e.g., 3V, based on a row address signal "address", a write-operation control signal WEp, and the like.

On the other hand, each of the word line driving circuit 21 retains all of the write word lines WLWp<0> and WLWp<1> at a non-selected state (the ground potential of 0V).

In such potential states, currents are supplied to the gate terminals of all of the anti-fuse elements 11a to 11d from each read bit line BLRp<0> and BLRp<1> through each read-gate n-type transistor 14a to 14d. Then, each potential is brought into a certain high-potential state, e.g., about 2V.

After that, the transition speed becomes slow. Keeping this state, the gate terminals of all of the anti-fuse elements 11a to 11d would, in the meantime, reach potentials approximate to that of the corresponding power supply VDD, e.g., about 2.5V.

Then, the memory cell power supply VBP is further boosted to a sufficiently high voltage, e.g., 6V, for breaking down the gate insulating film of each anti-fuse element 12a to 12d.

At this moment, the potentials of the gate terminals in all of the anti-fuse elements 12a to 12d have already reached substantially the same potentials as the corresponding power supplies VDD, thereby mitigating high-voltage stresses applied to each anti-fuse 12a to 12d. By this operation, any incorrect write operation may be prevented that could occur in a memory cell power supply VBP in booting. An explanation of the boost operation of the non-volatile semiconductor storage device according to the first embodiment has been given above.

Write Operation of the First Embodiment

Still referring to FIG. 3, a write operation of the non-volatile semiconductor storage device according to the first embodiment will be described below. Besides, in this example, it is assumed that the write operation is performed to the memory cell 11a.

Firstly, a word line driving circuit 21 brings the write word line WLWp<0> that selects a memory cell 11a for selection into a selected state (the same potential as a corresponding power supply VDD), e.g., 3V, based on a row address signal "address", a write-operation control signal WEp, and the like. Secondly, the word line driving circuit 21 brings the read word line WLRp<0> that is connected to the memory cell 11a into a non-selected state (the ground potential, of 0V). In addition, the word line driving circuit 21 maintains the other write word line WLWp<1> at a non-selected state (the ground potential of 0V) and the other read word line WLRp<1> at a selected state (the same potential as a corresponding power supply VDD), e.g., 3V.

Retaining this state, the data input/output buffer 31 brings the potential of the write bit line BLWn<0>, to which the memory cell 11a for selection is connected, to the ground potential of 0V, based on a write control signal WEn in negative logic, etc. As a result, the potential of the gate terminal in the anti-fuse element 12a is brought to 0V via the write-gate n-type transistor 13a in a conductive state and then a high-voltage stress of 6V is applied to the anti-fuse element 12a.

After a period of time maintaining this state, a gate insulating film of the anti-fuse element 12a causes a break down, a current of a few mA begins to flow to the gate terminal from the memory cell power supply VBP through the gate insulating film (to the direction as labeled B, in FIG. 3). By continually driving the write bit line BLWn<0> at the ground potential of 0V for a while after the current flow, the gate insulating film of the anti-fuse element 12a is completely broken down. This broken-down gate insulating film would not restore its original, good insulation property.

Here, similar to the memory cell 11a for selection, the write bit line BLWn<1> connected to the memory cell 11b, which is further connected to the write word line WLWp<0>, is retained at a potential of the corresponding power supply VDD, e.g., 3V. In addition, the potential of the gate terminal of the anti-fuse element 12b in the memory cell 11b is retained at a high potential via the write-gate n-type transistor 13b. By this operation, no high-voltage stress is applied to the anti-fuse element 1ab, no gate insulating film is broken down, and no incorrect write operation occurs.

Similarly, the following operation prevents incorrect write operations from being performed to memory cells 11c and 1id in non-selected states. A read word line WLRp<1> that is connected to the memory cell 11c and 1id in non-selected states is retained at a selected state (the same potential as a corresponding power supply VDD), e.g., 3V, thereby bringing read-gate n-type transistors 14c and 14d into conductive states. The read bit lines BLRp<0> and BLRp<1> with the same potentials as the corresponding power supplies VDD, e.g., 3V are electrically connected to each other via the read-gate n-type transistors 14c and 14d. Then, the gate terminal of each anti-fuse element 12c and 12d is retained at a high-potential state.

The write operation is terminated as follows: Firstly, the data input/output buffer 31 brings the write bit line BLWn<0> that is connected to the memory cell 11a for selection to the same potential as the corresponding power supply VDD, e.g., 3V. Then, the word line driving circuit 21 brings the write word line WLWp<0> that is connected to the memory cell 11a for selection back to the non-selected state (the ground potential of 0V), based on a write-operation control signal WEp, etc. In addition, the word line driving circuit 21 brings the read word line WLRp<0> that is also connected to the memory cell 11a for selection back to the selected state (the same potential as a corresponding power supply VDD), e.g. 3V. Then, the memory cell power supply VBP is cut off. After the potential of the memory cell power supply VBP has reached substantially the same potential, as the corresponding power supply VDD, the word line driving circuit 21 brings all of the read word lines WLRp<0> back to the non-selected state (the ground potential of 0V). An explanation of the write operation of the non-volatile semiconductor storage device according to the first embodiment has been given above.

That is, to briefly explain the write operation in the first embodiment, in the write operation mentioned above, each of the write-disturb prevention circuit 33 charges each of the read bit line BLRp<0> and BLRp<1> to a certain voltage of 3V. Further, in the write operation, the row decoder 2 activates the read word line WLRp<0>, to which the selected memory cell 11a is connected, to bring the read-gate n-type transistor 14a into a non-conductive state, whereas it activates the read word line WLRp<1>, to which the non-selected memory cells 11c and 11d are connected, to bring the read-gate n-type transistors 14c and 14d into conductive states.

Advantage(s) of the First Embodiment

Next, the advantage(s) of the non-volatile semiconductor storage device according to the first embodiment will be described below.

Here, as a comparative example of the first embodiment, a non-volatile semiconductor storage device will be described below, wherein each of a plurality of memory cells comprises a single anti-fuse element and a single n-type transistor (selection gate). In this comparative example, the n-type transistor has its drain connected to the gate terminal of the anti-fuse element, its source connected to a bit line, and its gate connected to a word line.

In this comparative example, when data is written to the memory cell to be written, the word line that is connected to the memory cell is brought into a selected state and the bit line that is connected to the memory cell is brought to 0V. By this operation, such a high-voltage stress is applied to the anti-fuse elements included in the memory cell to be written that is caused by the potential of a memory cell power supply, 6V and the potential of a bit line, 0V. At this moment, for the other non-selected memory cells that are connected to the bit lines of 0V, a high-voltage stress may be applied to the anti-fuse elements included in the memory cell in a non-selected state, due to the leak current flowing therethrough via a selection gate in a cut-off state. The resulting incorrect write fault is a write disturb fault.

The cause of the fault includes a leak current associated with a rise in potential of a non-selected word line, which should inherently be the ground potential of 0V, to bring a selection gate into a conductive state momentarily due to the effects of noise, etc., or other leak currents associated with a minute defect in an n-type transistor included in a selection gate.

In a non-volatile semiconductor storage device using anti-fuse elements, a memory cell power supply with such a high voltage is used that could break down an insulating film of an anti-fuse element. In addition, in the non-volatile semiconductor storage device using anti-fuse elements, the potential of the gate terminal in an anti-fuse element is determined by the balance between a minute leak current flowing through the gate insulating film and a cut-off current of the n-type transistor included in a selection gate. Thus, excessive reduction in potential of the gate terminal in the anti-fuse element would occur due to the minute leak current in an n-type transistor included in the selection gate. That is, the non-volatile semiconductor storage device of the comparative example has an extremely low tolerance for noise or minute defects.

In contrast, the non-volatile semiconductor storage device according to the first embodiment has a function for preventing so-called high-voltage stresses that, as described above, charges each read bit line BLRp<0> and BLRp<1> of the non-selected memory cells 11b to 11d to a certain voltage in a data write operation. Therefore, the non-volatile semiconductor storage device according to the first embodiment significantly improves the tolerance for noise or minute defects and prevents incorrect write faults, in other words, write disturb faults to unexpected memory cells that could be caused in a write operation. That is, the non-volatile semiconductor storage device according to the first embodiment obtains high reliability from the function for preventing high-voltage stresses to non-selected memory cells.

Second Embodiment

Configuration of the Second Embodiment

FIG. 1 is a schematic diagram of a non-volatile semiconductor storage device according to a second embodiment of the present invention. The non-volatile semiconductor storage device according to the second embodiment comprises a test read function that ascertains whether a piece of data may be read before writing data to an anti-fuse element, which significantly improves test coverage and provides high reliability. Besides, in the second embodiment, the same reference numerals represent the same components as the first embodiment mentioned above and description thereof will be omitted.

The non-volatile semiconductor storage device according to the second embodiment has different configurations in a row decoder 2' and a data input/output block 3' as compared to the first embodiment. In addition, the non-volatile semiconductor storage device according to the second embodiment has an additional test-read control signal line TRL. A test-read control signal TRp is input to the test-read control signal line TRL. The test-read control signal TRp is used by a memory cell 11 to ascertain whether a data write operation may be performed.

The row decoder 2' has a plurality of word line driving circuits 21' that are different from the first embodiment. In addition, the row decoder 2' also has a write word line driving control circuit 25. The write word line driving control circuit 25 generates an OR signal of a test read signal. TRp and a write-operation control signal WEp and outputs it to the write word line driving circuit 23.

Each of the word line driving circuit 21' has, similar to the first embodiment, a row selection logic circuit 22 and a write word line driving circuit 23. The difference in configuration of the word line driving circuit 21' as compared to the first embodiment is that it comprises a second read word line driving circuit 26 that has a different logic from that of the first read word line driving circuit 24 in the first embodiment. The second read word line driving circuit 26 is an AND circuit with two input terminals, one of which input terminals has a function for inverting an input signal, a write-operation control signal WEp.

The second read word line driving circuit 26 drives each of the read word line WLRp<0> to WLRp<3> based on the AND of an inverted signal of a write-operation control signal WEp and an output signal from a row selection logic circuit 22.

Besides, the write word line driving circuit 23 drives each write word line WLW<0> to WLW<3> based on the AND of an output signal from a row selection logic, circuit 22 and an output signal from a word line driving control circuit 25.

The data input/output block 3' has a plurality of data input/output buffers 31' that are different from the first embodiment. Each of the data input/output buffer 31' has, similar to the first embodiment, a write-disturb prevention circuit 33 and a read sense amplifier 34. Each of the data input/output buffer 31' also has a second write bit line driving circuit 35 with a different logic from that of the first write bit line driving circuits 32 in the first embodiment. The second write bit line driving circuit 35 is an OR circuit with two input terminals, one of which input terminals has a function for inverting each input signal DIp<0> to DIp<3>.

The second write bit line driving circuit 35 drives each write bit line BLWn<0> to BLWn<3> based on the OR of a test-read control signal TRp and an inverted signal of each input data line DIp<0> to DIp<3>.

Test Read Operation of the Second Embodiment

Figure 4:
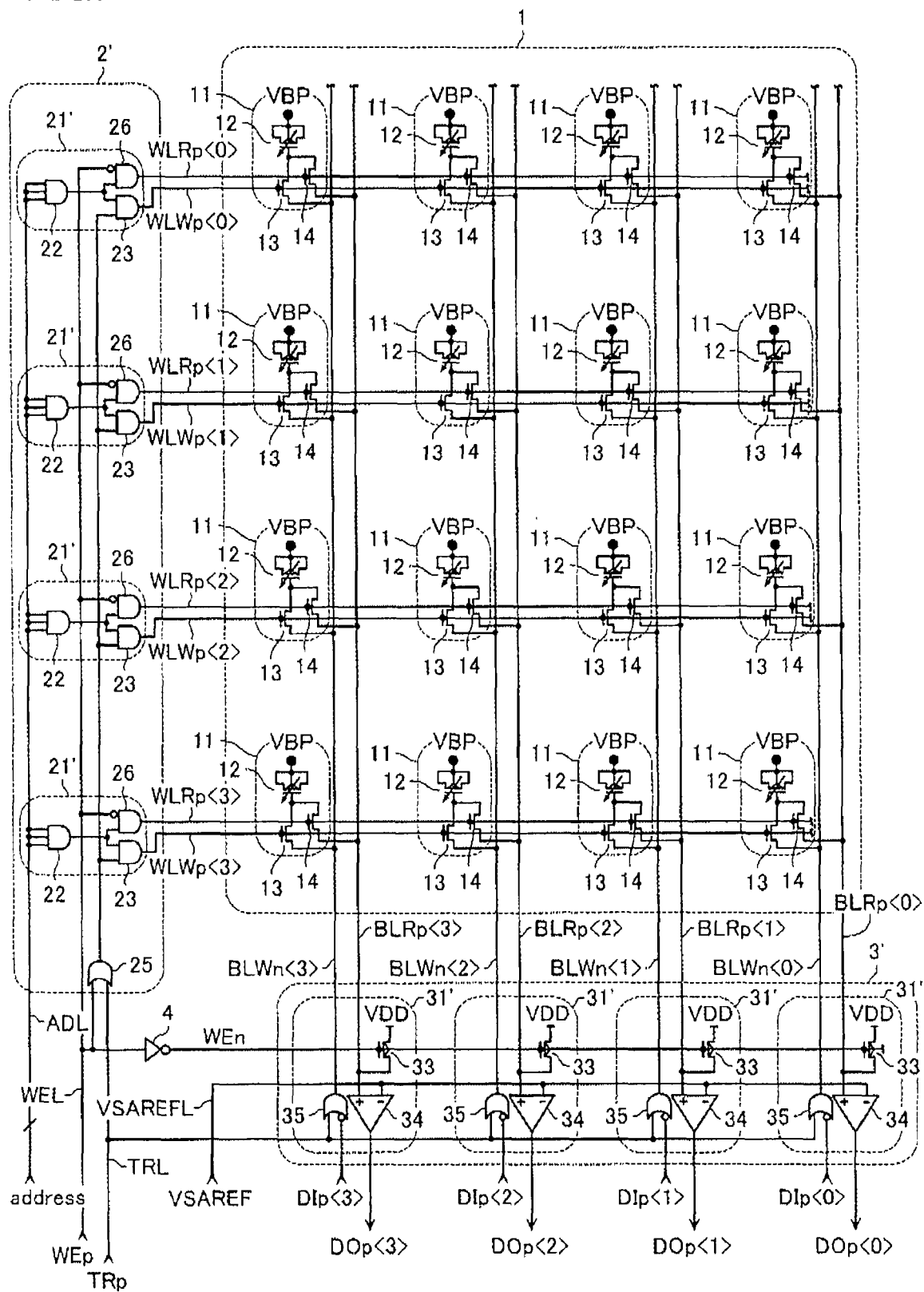
FIG. 4 is a schematic configuration diagram of a non-volatile semiconductor storage device according to a second embodiment of the present invention.
Figure 5:
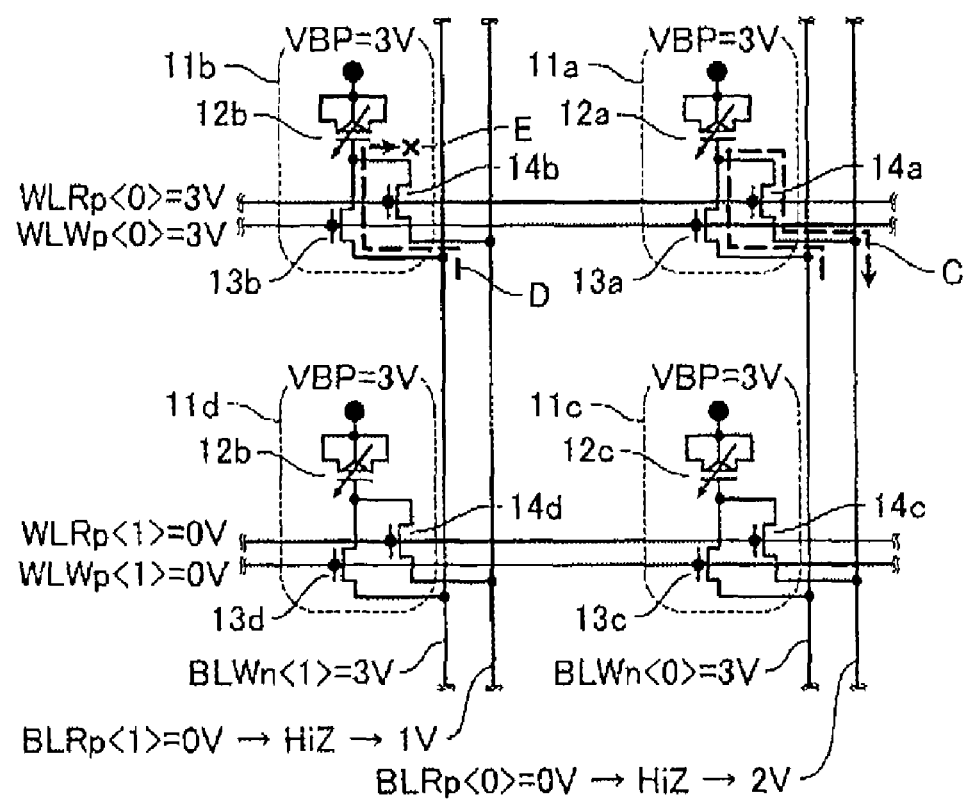
FIG. 5 is a diagram illustrating a test read operation of the non-volatile semiconductor storage device according to the second embodiment of the present invention.

With reference to FIG. 5, a test read operation will now be described below that is characteristic of the second embodiment. FIG. 5 is a diagram illustrating a test read operation of the non-volatile semiconductor storage device according to the second embodiment. Although, for simplicity, only four memory cells 11 are illustrated in FIG. 5 that are described in conjunction with FIG. 4, other non-selected memory cells 11 that are not illustrated in FIG. 5 also operate in a similar manner. In addition, in FIG. 5, the same reference numerals represent the same components as FIG. 4. Besides, in the example illustrated in FIG. 5, it is assumed that the test read operation is performed to the memory cell 11*a*.

In this test read operation, the memory cell power supply VBP first switches to such a low voltage of 3V that would not break down the gate insulating film of each of the anti-fuse element 12*a* to 12*d*. Retaining this state, the word line driving circuit 21' brings the read word line WLRp<0> and the write word line WLWp<0> that are connected to memory 25, cells 11*a* and 11*b* into a selected state (the same potential as a corresponding power supply VDD), e.g., 3V, based on a row address signal "address" and a write-operation control signal WEp. On the other hand, the word line driving circuit 21' brings the other read word line WLRp<1> and write word line WLWp<1> into a non-selected state (the ground potentials of 0V). By this operation, memory cells 11*a* and 11*b* in an arbitrary row are electrically connected to read bit lines BLRp<0> and BLRp<1>, while the other two memory cells 11*c* and 11*d* are electrically disconnected from these read bit lines BLRp<0> and BLRp<1>. In addition, each of the data input/output buffer 31' brings all of the write bit lines BLWn<0> and BLWn<1> to the same potential as a corresponding power supply VDD, e.g., 3V. Retaining this state, each of the data input/output buffer 31' initializes all of the read bit lines BLRp<0> and BLRp<1> to 0V.

Then, each of the data input/output buffer 31' brings all of the read bit lines BLRp<0> and BLRp<1> into a high-impedance state HiZ. In addition, write-gate n-type transistors 13*a* and 13*b* in the memory cells 11*a* and 11*b* in a row selected in a similar manner are brought into conductive states and connected to write bit lines BLWn<0> and BLWn<1>, while the other two memory cell 11*c* and 11*d* are disconnected from these write bit lines BLWn<0> and BLWn<1>.

By the above-mentioned operation, a current path is formed that reaches each of the read bit line BLRp<0> and BLRp<1>, from each of the write bit line BLWn<0> and BLWn<1>, through the gate terminals of the write-gate n-type transistors 13*a* and 13*b*, each of the anti-fuse 12*a* and 12*b*, and then through the read-gate n-type transistors 14*a* and 14*b* (as labeled C and D, in FIG. 5). In this state, similar to the above-mentioned read operation, the read sense amplifier 34 of each data input/output buffer 31' compares the potential of each read bit line BLRp<0> and BLRp<1> with a reference potential VSAREF to read a result. This enables detection for faults, such as open faults or zero-fix faults, in the selected memory cells 11*a* and 11*b*.

For example, as illustrated in FIG. 5, if there is no open fault or zero-fix fault in the memory cell 11*a*, the read bit line BLRp<0>, to which the memory cell 11*a* is connected, would have a relatively high potential. Accordingly, the read bit line BLRp<0> connected to the normal memory cell 11*a* has a relatively high potential (e.g., 2V). The read sense amplifier 34 detects that the potential of the read bit line BLRp<0> connected to the normal memory cell 11*a* is higher than the reference potential VSAREF. Then, the read sense amplifier 34 drives the output DOp<0> at the same potential as a corresponding power supply VDD, e.g., 3V.

On the other hand, as illustrated in FIG. 5, if there is an open fault or a zero-fix fault in the memory cell 11*b* as indicated by E, the current path would be blocked in the memory cell 11*b*. That is, due to the effects of the current path blockage, the read bit line BLRp<1>, to which the memory cell 11*b* is connected, remains at a relatively low potential (e.g., 1V). The read sense amplifier 31 detects that the potential of the read bit line BLRp<1> connected to the memory cell 11*b* with such a fault is lower than the reference potential VSAREF and drives the output signal DOp<1> at the ground potential of 0V accordingly. An explanation of the test read operation of the non-volatile semiconductor storage device according to the second embodiment has been given above.

That is, to briefly explain the test read operation in the second embodiment, in the test read operation mentioned above, the data input/output block 3' applies 3V (a first voltage) to each of the write bit line BLWn<0> and BLWn<1> according to each input signal DIp<0> to DIp<3> and a test read signal TRp, and brings each of the read bit line BLRp<0> and BLRp<1> into a high-impedance state HiZ. In other words, the data input/output block 3' applies a second voltage other than 3V to each of the read bit line BLRp<0> and BLRp<1>. Then, the row decoder 2' activates the write word line WLWp<0> and the read word line WLRp<0>, to which the selected memory cells 11*a* and 11*b* are connected, based on an address signal "address" and the test read signal TRp to bring the write-gate n-type transistor 13 and the read-gate n-type transistor 14 into conductive states. On the other hand, the row decoder 2' inactivates the write word line WLWp<1> and the read word line WLRp<1>, to which the other two non-selected memory cells 11*c* and 11*d* are connected to bring the write-gate n-type transistors 13*c* and 13*d* and the read-gate n-type transistors 14*c* and 14*d* into non-conductive states.

Advantage(s) of the Second Embodiment

Next, the advantage(s) of the non-volatile semiconductor storage device according to the second embodiment will be described below.

Here, as a comparative example of the second embodiment, a non-volatile semiconductor storage device will be described below, wherein each of a plurality of memory cells comprises a single anti-fuse element and a single n-type transistor (selection gate). In this comparative example, the n-type transistor has its drain connected to the gate terminal of the anti-fuse element, its source connected to a bit line, and its gate connected to a word line. In addition, it is assumed that there is an open fault or a zero-fix fault in any of memory cells. In this comparative example, it is difficult to detect a fault before a write operation to the memory cell. For example, a word line, to which the memory cell is connected, is brought into a selected state (the same potential as a corresponding power supply VDD), e.g., 3V. By this operation, the potential of the bit line connected to the faulty memory cell remains at a relatively low potential, e.g., about 1V. On the other hand, since anti-fuse elements provide substantially no current before a write operation, the potential of the bit line, to which a no-fault memory cell selected at the same time is connected, also remains at a relatively low potential, e.g., about 1V. Since the comparative example is brought into the above-mentioned states, it is difficult to distinguish whether or not there is an open fault or a zero-fix fault in a memory cell.

In contrast, the non-volatile semiconductor storage device according to the second embodiment may detect an open fault or a zero-fix fault in a memory cell by the above-mentioned test read operation. That is, with a test read function as in the second embodiment, a significant improvement in the test coverage and high reliability may be achieved.

Third Embodiment

Configuration of the Third Embodiment

Figure 6:
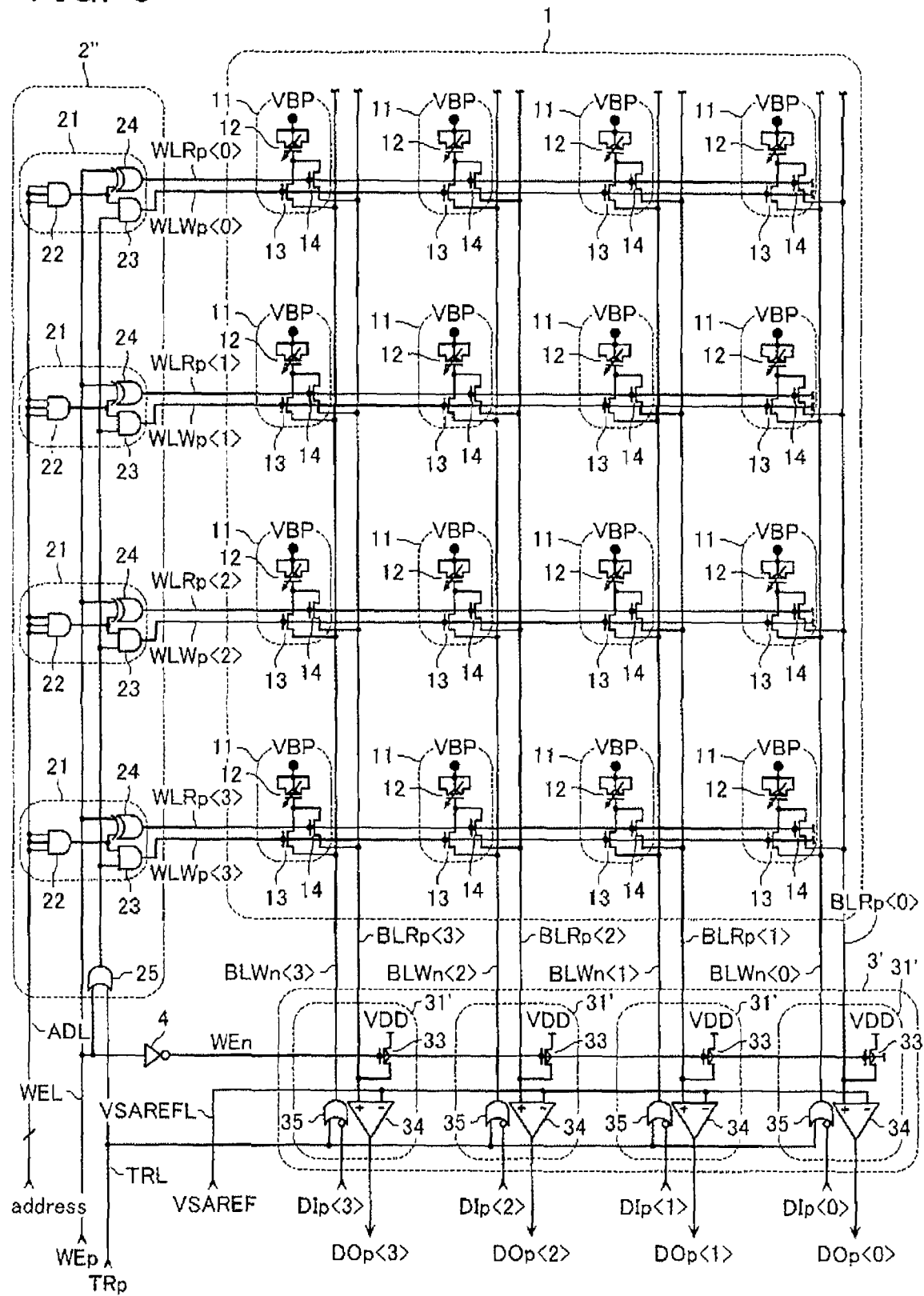
FIG. 6 is a schematic configuration diagram of a non-volatile semiconductor storage device according to a third embodiment of the present invention.

FIG. 6 is a schematic diagram of a non-volatile semiconductor storage device according to a third embodiment of the present invention. The non-volatile semiconductor storage device according to the third embodiment has both functions of the first and second embodiments. Besides, in the third embodiment, the same reference numerals represent the same components as the first and second embodiments mentioned above and description thereof will be omitted.

The non-volatile semiconductor storage device according to the third embodiment has a different configuration in a row decoder 2″ as compared to the second embodiment.

The row decoder 2″ replaces the second read word line driving circuit 26 with the first read word line driving circuit 24, the circuit 26 being in the configuration of the row decoder 2′ of the second embodiment. Therefore, the first read word line driving circuit 24, similar to the first embodiment, drives each of the read word line WLRp<0> to WLRp<3> based on the XOR of a write-operation control signal WEp and an output signal from a row selection logic circuit 22.

The operation of the non-volatile semiconductor storage device according to the third embodiment is similar to those described in the first and second embodiments and description thereof will be omitted.

As described above, the nonvolatile semiconductor storage device according to the third embodiment comprises a function for preventing high-voltage stresses to a non-selected memory cell that could be caused in a write operation and may prevent any write disturb fault. The non-volatile semiconductor storage device according to the third embodiment also comprises a test read function that ascertains whether a piece of data may be read before writing data to an anti-fuse element, which may significantly improve test coverage.

Fourth Embodiment

Configuration of the Fourth Embodiment

Figure 7:
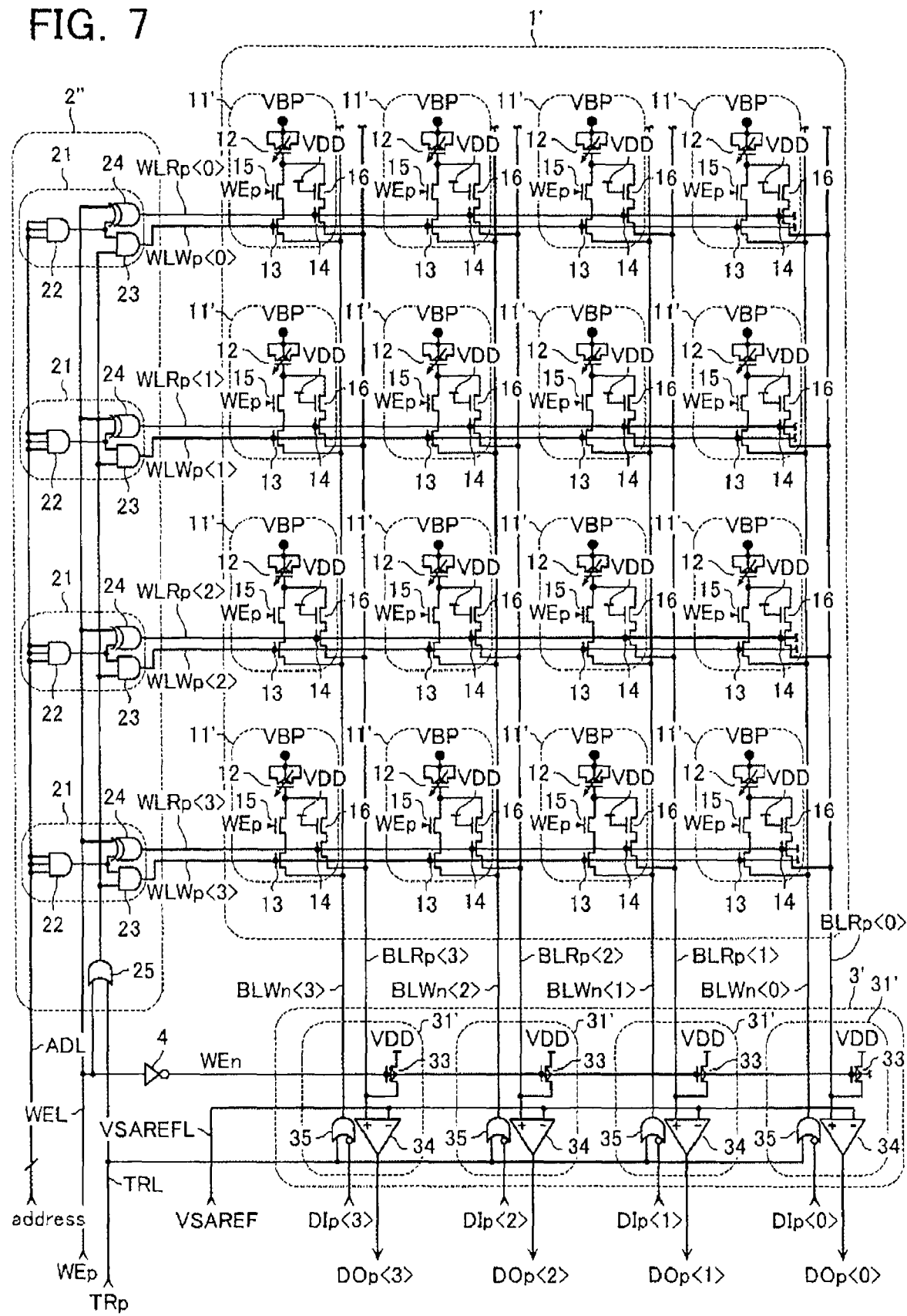
FIG. 7 is a schematic configuration diagram of a non-volatile semiconductor storage device according to a fourth embodiment of the present invention.

FIG. 7 is a schematic diagram of a non-volatile semiconductor storage device according to a fourth embodiment of the present invention. The non-volatile semiconductor storage device according to the fourth embodiment comprises: a function for preventing high-voltage stresses to a non-selected memory cell that could be caused in a write operation; and a function for preventing write disturb faults. Further, the non-volatile semiconductor storage device according to the third embodiment comprises a test read function that ascertains whether a piece of data may be read before writing data to an anti-fuse element, which may improve test coverage. Besides, in the fourth embodiment, the same reference numerals represent the same components as the first to third embodiments mentioned above and description thereof will be omitted.

The non-volatile semiconductor storage device according to the fourth embodiment has a different configuration in a memory cell array 1′ as compared to the third embodiment. The memory cell array 1′ has a plurality of memory cells 11′ that are different from the third embodiment. In each memory cell 11′, a write control n-type transistor 15 is provided between the gate terminal of an anti-fuse element 12 and a write-gate n-type transistor 13. Similarly, a read barrier n-type transistor 16 is provided between the gate terminal of the anti-fuse 12 and a read-gate n-type transistor 14.

A write control signal line WEL is connected to the gate terminal of the write control n-type transistor 15. A read barrier n-type transistor 16 is connected to a corresponding power supply VDD.

Write Operation of the Fourth Embodiment

Figure 8:
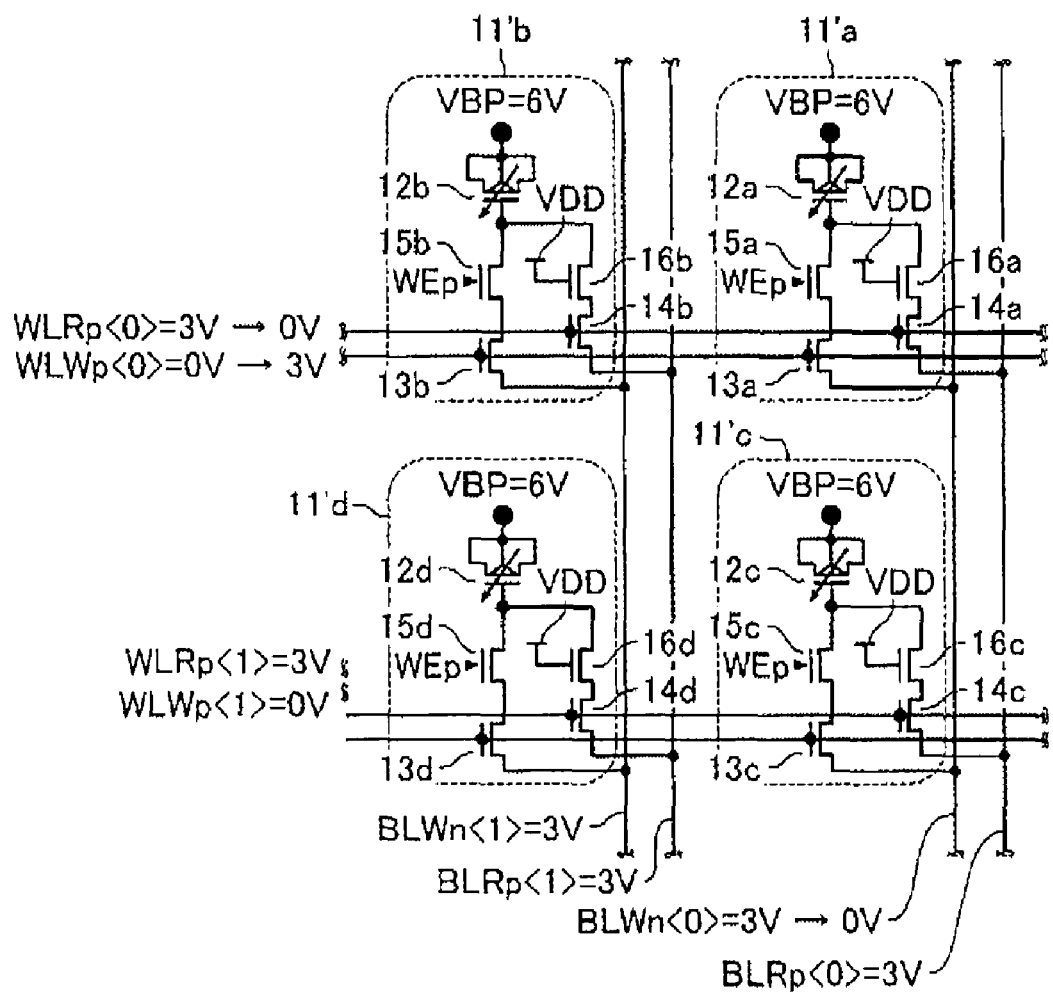
FIG. 8 is a diagram illustrating a write operation of the non-volatile semiconductor storage device according to the fourth embodiment of the present invention.

The write control n-type transistor 15 and the read barrier n-type transistor 16 are each responsible for mitigating a high-potential stress that could be applied to the write-gate n-type transistor 13 and the read-gate n-type transistor 14 in a write operation. Next, a write operation of the non-volatile semiconductor storage device according to the fourth embodiment will be described below with reference to FIG. 8. FIG. 8 is a diagram illustrating a write operation of the non-volatile semiconductor storage device according to the fourth embodiment. Although, for simplicity, only four memory cells 11′ are illustrated in FIG. 8 that are described in conjunction with FIG. 7, other non-selected memory cells 11′ that are not illustrated in FIG. 8 also operate in a similar manner. In addition, in FIG. 8, the same reference numerals represent the same components as FIG. 7. Besides, the write operation of the fourth embodiment is similar to that described in the first embodiment and so will not described in detail herein. Here, an explanation will be given to the effects of mitigating a high-potential stress that could be applied to the write control n-type transistor 15 and the read barrier n-type transistor 16. In addition, in FIG. 8, it is assumed that the write operation is performed to the memory cell 11′a.

The word line driving circuit 21 brings the write word line WLWp<0> that is connected to the memory cell 11′a into a selected state (the same potential as a corresponding power supply VDD), e.g., 3V based on a row address signal "address", a write-operation control signal WEp, etc. Then, the word line driving circuit 21 brings the read word line WLRp<0> that is combined with the write word line WLWp<0> into a non-selected state (the ground potential of 0V). In addition, the word line driving circuit 21 brings the write bit line BLWn<0> that is connected to the memory cell 11′a to be written to the ground potential of 0V and the read bit line BLRp<0> to the same potential as a corresponding power supply VDD, e.g., 3V. Retaining this state at the word line driving circuit 21, a voltage stress is applied to the anti-fuse element 12a, with a potential of a corresponding memory cell power supply VBP, e.g., 6V, and then data is written. This write operation is similar to that described in the first embodiment, regardless of the presence of the write-gate n-type transistor 13 and the read-gate n-type transistor 14.

At this moment, in a memory cell 11′b in the same row as the memory cell 11′a to be written, the effects of mitigating a high-potential stress to the read-gate n-type transistor 14b may be obtained from an active read barrier n-type transistor 16b. If data has already been written to the memory cell 11′b, then the anti-fuse element 12b is in a conductive state and the potential of the gate terminal is brought to the same potential as the memory cell power supply VBP, e.g., 6V. Alternatively, if a read barrier n-type transistor 16b is not inserted, then the drain terminal of the read-gate n-type transistor 14b is brought to 6V and a high-voltage stress of 6V is applied between the drain terminal and the gate terminal connected to the recd word line WLRp<0> of 0V. By inserting a read barrier n-type transistor 16b thereto that has its gate terminal connected to a corresponding power supply VDD, the potential of the drain terminal of the read-gate n-type transistor 14b is suppressed to the potential of the corresponding power supply VDD, e.g., not more than 3V. In addition, since the gate terminal of the read barrier n-type transistor 16b is connected to the corresponding power supply VDD, a high-voltage stress to the read barrier n-type transistor 16b itself is also mitigated.

Similarly, in the other two memory cells 11'c and 11'd, there is seen an effect of mitigating a high-potential stress to the write-gate n-type transistors 13c and 13d, resulting from the active write control n-type transistors 15c and 15d. If data has already been written to the memory cells 11'c and 11'd, then the anti-fuses 12c and 12d are in conductive states and the potentials of these gate terminals are brought to the same potential as the memory cell power supply VBP, e.g., 6V.

Alternatively, if write control n-type transistors 15c and 15d are inserted, then the drain terminal of each write-gate n-type transistor 13c and 13d is brought to 6V and a high-voltage stress of 6V is applied between the drain terminal and the gate terminal connected to the write word line WLWp<1> of 0V.

By providing each of the write control n-type transistor 15c and 15d that has its gate terminal connected to a write-operation control signal WEp, the potential of the drain terminal of each write-gate n-type transistor 13c and 13d is suppressed to the potential of the corresponding power supply VDD, e.g., not more than 3V. In addition, if the potential of the write-operation control signal WEp is maintained at the same potential as a corresponding power supply VDD, e.g., 3V when the memory cell power supply VBP is in a high-voltage state, e.g., in 6V, then high-voltage stresses to the write control n-type transistors 15c and 15d themselves are also mitigated.

As described above, the non-volatile semiconductor storage device according to the fourth embodiment comprises a function for preventing high-voltage stresses to a non-selected memory cell that could be caused in a write operation and may prevent any write disturb fault. The non-volatile semiconductor storage device according to the fourth embodiment also comprises a test read function that ascertains whether a piece of data may be read before writing data to an anti-fuse element, which may improve test coverage. The non-volatile semiconductor storage device according to the fourth embodiment further comprises a read barrier n-type transistor 16 that has its gate terminal, fixed to the potential of the corresponding power supply, which may mitigate a high-voltage stress that could be applied to a write gate and a read gate. That is, the non-volatile semiconductor storage device according to the fourth embodiment may obtain high reliability.

While various embodiments of the present invention have been described above, it should be understood that the present invention is not limited to those embodiments described herein and various changes, additions and substitutions in the form and details of those embodiments may be made by those skilled in the art without departing from the spirit of the invention. For example, in the above-described embodiments, although the transistors 13, 14, 15 and 16 in each memory cell 11 and 11' are of n-type, those may be of p-type and each row decoder 2, 2' and 2" may be modified to have a corresponding circuit configuration. In addition, although the transistors in each data input/output buffer 31 and 31' are of p-type, those may be of n-type and each data input/output buffer 31 and 31' may be modified to have a corresponding circuit configuration.

What is claimed is:

1. A non-volatile semiconductor storage device comprising:
   a memory cell array including a plurality of memory cells arranged in a grid configuration, each of the plurality of memory cells comprising an irreversible storage element adapted to write data by breaking down an insulating film, with a write voltage being applied to its one end, a first transistor with its one end being connected to the other end of the irreversible storage element, and a second transistor with its one end being connected to the other end of the irreversible storage element;
   a plurality of write word lines connected to a gate of the first transistor to select the memory cell in a row direction in writing data;
   a plurality of read word lines connected to a gate of the second transistor to select the memory cell in a row direction in reading data;
   write bit lines connected to the other end of the first transistor to write data to the memory cells;
   read bit lines connected to the other end of the second transistor to read data from the memory cells;
   a row decoder selectively driving the write word lines and the read word lines according to an address signal; and
   a write-disturb prevention circuit for, in writing data, charging the read bit lines to a certain voltage.

2. The non-volatile semiconductor storage device according to claim 1, wherein the row decoder, in writing data,
   inactivates the read word line connected to the selected memory cell to bring the second transistor into a non-conductive state; whereas
   activates the read word line connected to the non-selected memory cells to bring the second transistor into a conductive state.

3. The non-volatile semiconductor storage device according to claim 1, wherein
   the write-disturb prevention circuit comprises a p-type MOS transistor, the p-type MOS transistor having a source terminal connected to a power supply potential, a drain terminal, connected to the read bit lines, and a gate terminal provided with a write control signal.

4. The non-volatile semiconductor storage device according to claim 1, wherein the memory cell comprises:
   a third transistor with both ends connected between the irreversible storage element and one end of the first transistor and a gate provided with a certain voltage; and
   a fourth transistor with both ends connected between the irreversible storage element and one end of the second transistor and a gate provided with a certain voltage.

5. The non-volatile semiconductor storage device according to claim 1, wherein
   the row decoder comprises:
   a row selection logic circuit receiving a row address signal;
   a write word line driving circuit receiving an output from the row selection logic circuit; and
   a first read word line driving circuit receiving an output from the row selection logic circuit,
   wherein the write word line driving circuit and the first read word line driving circuit receives a write-operation control signal, wherein the write word line driving circuit drives the write word line based on the write-operation control signal and an output signal from the row selection circuit, and wherein the first read word line driving circuit drives the read word line based on the write-operation control signal and an output signal from the row selection circuit.

6. The non-volatile semiconductor storage device according to claim 1 comprising a data input/output block receiving a write signal, driving the write bit lines, and amplifying a read signal input via the read bit lines to output the read signal, the data input/output block comprising:
   a first write bit line driving circuit receiving the write signal and driving the write bit lines; and
   a read sense amplifier having a first input terminal connected to the read bit lines, and a second input terminal connected to a reference power supply.

7. A non-volatile semiconductor storage device comprising:
   a memory cell array including a plurality of memory cells arranged in a grid configuration, each of the plurality of memory cells comprising an irreversible storage element adapted to write data by breaking down an insulating film, with a write voltage being applied to its one end, a first transistor with its one end being connected to the other end of the irreversible storage element, and a second transistor with its one end being connected to the other end of the irreversible storage element;
   a plurality of write word lines connected to a gate of the first transistor to select the memory cell in a row direction in writing data;
   a plurality of read word lines connected to a gate of the second transistor to select the memory cell in a row direction in reading data;
   write bit lines connected to the other end of the first transistor to write data to the memory cells;
   read bit lines connected to the other end of the second transistor to read data from the memory cells;
   a row decoder selectively driving the write word lines and the read word lines according to an address signal and a test signal; and
   a data input/output block applying a first voltage to the write bit lines and a second voltage to the read bit lines according to an input signal and the test signal, the second voltage being different from the first voltage.

8. The non-volatile semiconductor storage device according to claim 7, wherein the row decoder
   activates the write word lines and the read word lines connected to the selected memory cell based on an address signal and a test signal to bring the first transistor and the second transistor into conductive states, whereas
   inactivates the write word lines and the read word lines connected to the non-selected memory cells to bring the first transistor and the second transistor into non-conductive states.

9. The non-volatile semiconductor storage device according to claim 7 comprising a write-disturb prevention circuit charging the read bit lines to a certain voltage in writing data.

10. The non-volatile semiconductor storage device according to claim 7, wherein the row decoder, in writing data,
   inactivates the read word line connected to the selected memory cell to bring the second transistor into a non-conductive state, whereas
   activates the read word line connected to the non-selected memory cells to bring the second transistor into a conductive state.

11. The non-volatile semiconductor storage device according to claim 9, wherein the write-disturb prevention circuit comprises a p-type MOS transistor, the p-type MOS transistor having a source terminal connected to a power supply potential, a drain terminal connected to the read bit lines, and a gate terminal provided with a write control signal.

12. The non-volatile semiconductor storage device according to claim 7, wherein each of the memory cells comprise:
   a third transistor with both ends being connected between the irreversible storage element and one end of the first transistor and a gate provided with a certain voltage; and
   a fourth transistor with both ends being connected between the irreversible storage element and one end of the second transistor and a gate provided with a certain voltage.

13. The non-volatile semiconductor storage device according to claim 7, wherein
   the row decoder comprises:
      a row selection logic circuit receiving a row address signal;
      a write word line driving circuit receiving an output from the row selection logic circuit;
      a second read word line driving circuit receiving an output from the row selection logic circuit; and
      a word line driving control circuit receiving the test signal and a write-operation control signal;
   the word line driving control circuit outputs to the write word line driving circuit an output signal based on the test signal and the write-operation control signal;
   the write word line driving circuit drives the write word line based on an output signal from the row selection logic circuit and an output signal from the word line driving control circuit; and
   the second read word line driving circuit drives the read word line based on the AND of an output signal from the row selection logic circuit and an inverted signal of the write-operation control signal.

14. The non-volatile semiconductor storage device according to claim 7, wherein
   the row decoder comprises:
      a row selection logic circuit receiving a row address signal;
      a write word line driving circuit receiving an output signal from the row selection logic circuit;
      a second read word line driving circuit receiving an output signal from the row selection logic circuit; and
      a word line driving control circuit receiving the test signal and a write-operation control signal,
   wherein the word line driving control circuit outputs to the write word line driving circuit an output signal, based on the test signal and the write-operation control signal,
   wherein the write word line driving circuit drives the write word line based on an output signal from the row selection logic circuit and an output signal from the word line driving control circuit, and
   wherein the first read word line driving circuit drives the read word line based on the write-operation control signal and an output signal from the row selection circuit.

15. The non-volatile semiconductor storage device according to claim 7, wherein the data input/output block comprises:
   a second write bit line driving circuit driving the write bit lines based on the test signal and an inverted signal of a write signal; and
   a read sense amplifier having a first input terminal connected to the read bit lines and a second input terminal connected to a reference power supply.

* * * * *